(12) United States Patent
Forman

(10) Patent No.: US 12,538,708 B1
(45) Date of Patent: Jan. 27, 2026

(54) ADJUSTABLE PIEZOELECTRIC VIBRATION SENSOR

(71) Applicant: Suncourt, Inc., Durant, IA (US)

(72) Inventor: David James Forman, Coralville, IA (US)

(73) Assignee: Suncourt, Inc., Durant, IA (US)

(*) Notice: Subject to any disclaimer, the term of this patent is extended or adjusted under 35 U.S.C. 154(b) by 799 days.

(21) Appl. No.: 17/949,756

(22) Filed: Sep. 21, 2022

Related U.S. Application Data

(60) Provisional application No. 63/246,670, filed on Sep. 21, 2021.

(51) Int. Cl.
| | | |
|---|---|---|
| *H10N 30/00* | (2023.01) | |
| *H04R 17/00* | (2006.01) | |
| *H10N 30/02* | (2023.01) | |
| *H10N 30/30* | (2023.01) | |

(52) U.S. Cl.
CPC ............. *H10N 30/02* (2023.02); *H04R 17/00* (2013.01); *H10N 30/302* (2023.02)

(58) Field of Classification Search
CPC ....... H10N 30/02; H10N 30/302; H04R 17/00
See application file for complete search history.

(56) References Cited

U.S. PATENT DOCUMENTS

2022/0238784 A1* 7/2022 Kappert ............... H03K 17/964

* cited by examiner

*Primary Examiner* — Julio C. Gonzalez
(74) *Attorney, Agent, or Firm* — Simmons Perrine PLC

(57) ABSTRACT

A standalone vibration detector switch which is free of any accelerometers, strain gauges, spring-vibration switches, or eddy-current sensors, but instead utilizes a piezoelectric transducer disk to sense vibration of the object to which the device makes physical contact. The device does not rely on the harvesting of autarkic energy generated by large changes in the piezo transducer's motion or deflection, but rather measures the instantaneous voltage of the element's sinusoidal output when subjected to continuous, consistent vibration. The device further compares this sinusoidal output to an adjustable threshold thereby confirming the operational state of the object to which the device makes physical contact.

5 Claims, 14 Drawing Sheets

ADJUSTABLE PIEZOELECTRIC VIBRATION SENSOR

FIELD OF THE INVENTION

The present invention relates generally to Heating, Ventilation, and Cooling, hereafter "HVAC" equipment and systems. More specifically, the present invention relates to methods and systems for controlling or synchronizing related powered accessories to such HVAC equipment and systems.

BACKGROUND OF THE INVENTION

HVAC systems in a residential, institutional, or commercial setting at times require the addition of ancillary accessory devices to increase/adjust comfort in the conditioned space, meet local or national building codes with respect to ventilation, increase the efficacy of the HVAC system, or otherwise add desired functionality to the HVAC system. These accessory devices may be optionally integrated into the HVAC air moving device, but are more often not customarily incorporated into the HVAC air moving device when part of a permanent split system consisting of an indoor furnace or air handler and an outdoor condenser or heat pump rated for typical residential load capacities.

Said accessory devices, hereafter "accessories" include, but are not limited to: duct humidifiers, electrostatic air cleaners, motorized outdoor air inlet dampers, air-side economizers, motorized zoning dampers or controlled systems thereof, or germicidal ultraviolet lighting for coil or duct sanitation. These accessories typically require a 24V AC power source and/or control signal source if they are to be run intermittently.

Electrical provisions for synchronizing these accessories with the HVAC equipment are at times, included in the control compartment of said appliance. The requisite electrical connections are relatively straightforward for the professional installer, but often challenging for a novice or first-time installer of these accessories. Moreover, these electrical connections can potentially consist of proprietary electrical connectors or proprietary electrical signaling specific to the manufacturer of both the HVAC equipment and the powered accessory intended for connection to said equipment. In this instance, the installer is prevented from using what they may consider a preferred or more economical accessory of their choosing without utilizing an alternate means of electrical integration with the HVAC equipment.

Alternate means of electrical integration with the HVAC equipment can include isolation relays, current-sensing switches, airflow-actuated or "sail" switches, positive pressure switches or differential pressure switches. Each method has its own merit, but also carries with it a degree of difficulty or requisite knowledge of industry-standard installation methods or tools.

The isolation relay consisting of a normally-open single-pole contact with a 24 VAC coil is the most economical method but is also the method with which the most skill is required of the installer. Current sensing relays intended for semi-permanent mounting to the blower's electrical wire are the easiest to implement, provided the installer is familiar with the process by which the proper blower wire lead can be identified on the equipment's wiring diagram; and the installer is comfortable performing work within the interior of the HVAC equipment.

The sail switch has an advantage over the prior methods in that it does not require the installer to enter the interior of the HVAC air moving device. The sail switch is activated when a polyester film "sail" of sufficient area is moved by the presence of airflow such that a microswitch is actuated by the lever action of the sail. This method requires no additional parts to implement but does require hand tools specific to ductwork to install. For the novice installer in particular, if the aim of this method is to integrate the operation of a first-time purchase of an HVAC accessory, the added cost of duct cutting shears would make this a less attractive solution. Furthermore, the device itself is the most expensive of all electrical integration methods explained herein.

The positive pressure switch also does not require any work within the interior of the HVAC equipment and has the added advantage that its installation can be accomplished with tools that are commonplace to both professionals and novice installers. Since the switch is actuated by positive pressure, it must be mounted on the exhaust duct or supply plenum in proximity to the HVAC air moving device. In the case of a split-system air handler, this pressure switch would be mounted on the vertical supply plenum. In some instances, the evaporator coil is not encased in an equipment housing, but rather is installed inside of the supply plenum. Its location and proximity to the exterior walls of the plenum are therefore obscured. The installer runs the risk of puncturing the coil while drilling the requisite holes for mounting the positive pressure switch. This switch cannot be mounted on the underside of an adjacent horizontal duct served by this plenum since a diaphragm switch has limitations on physical orientation for proper operation. So, installing such a switch in a safe location can be daunting or can involve working within very tight spaces if the side of the adjacent horizontal duct is in close proximity to obstructions such as pipes, other ducts, or joists as is often the case with cramped mechanical rooms.

The differential pressure switch shares the same installation advantages as the positive pressure switch. Since either one or both of the sensing ports are remote to the switch location, it is easier to find a suitable location to mount this switch. The differential pressure switch option often requires the additional purchase of tubing and duct fittings, so it carries with it some often overlooked additional costs for installation.

Each of these options describe the means by which the HVAC equipment will control the operation of the accessory (e.g.: switch the accessory on or off). But for every option listed, a power supply for both the accessory and the switching means is required. The supply power can be sourced from the HVAC air moving device provided such provisions and correct voltages are available for said connection. The supply power can also be sourced from a secondary power supply provided the entirety of the signal and power wiring for this accessory are independent of the HVAC air moving device's control wiring. This secondary supply can take the form of a hard-wired transformer for permanent installation on a standard electrical box or a plug-in transformer that converts a household 120 VAC outlet voltage to the accessory's requisite supply voltage.

It should be evident that the least expensive options carry disadvantages for the novice installer and those options which are easiest to install are often the most expensive for the novice and professional alike.

Consequently, there exists a need for improved methods and systems for electrically integrating or synchronizing these accessory devices to the primary air moving device within the HVAC system.

SUMMARY OF THE INVENTION

It is an object of the present invention to provide an efficient method and system for interlocking powered HVAC accessory device operation with the operation of a furnace, air handler, or other motorized air moving device.

It is a feature of the present invention to synchronize the operation of an HVAC accessory device to the motorized air moving device without any electrical interdependencies among said devices.

It is an advantage of the present invention to eliminate the need to access the dangerous high-voltage internal wiring disposed in the blower compartment of the motorized air moving device.

It is another feature of the present invention to install without the use of specialized tools specific to the HVAC trade.

It is another advantage of the present invention to adopt a physical structure that is non-invasive with respect to the detected appliance or device to which the present invention is installed.

It is another feature of the present invention to require no supplementary materials or connectors in order to accomplish the detection of the motorized air moving device operation.

It is another advantage of the present invention to allow for installation and interlock of HVAC accessory devices by installers with a lower ability level.

It is another feature of the present invention to detect the acute isochronal displacement of the motorized air moving device in order to determine the operational state of said device.

It is another advantage of the present invention to accomplish the above-mentioned detection without accelerometers, strain gauges, spring-vibration switches, eddy-current sensors, or mass-loaded flexible film piezoelectric sensors.

It is another feature of the present invention to utilize a circular piezoelectric transducer as a vibration-sensing instrument.

It is another feature of the present invention to include a means for adjusting the sensitivity of the device.

The present invention is designed to achieve the above-mentioned objectives, include the previously stated features, and provide the aforementioned advantages.

The present invention is a system for controlling the on/off state of an HVAC accessory device comprising: a means for detecting vibration; where the vibration is determinative of the operational state of a proximate motorized air movement device; a piezoelectric transducer; configured as a vibration-sensing instrument to detect vibration; an amplifier; configured to augment the signal from said piezoelectric transducer; a magnitude comparator; configured to compare the amplified output of said means of vibration detection to an adjustable setpoint threshold; an isolated output; configured to allow the conveyance of electrical power from one terminal pair to an adjacent terminal pair to provide switched power to an accessory device.

DETAILED DESCRIPTIONS OF THE INVENTION

Although described with particular reference to a vibration sensor switch for controlling accessories of an HVAC system, the systems and methods of the present invention can be implemented in many different types of devices to be used with any motorized appliance that exhibits a detectable vibration in the course of normal operation.

In an embodiment, the system and method of the present invention described herein can be viewed as examples of many potential variations of the present invention which are protected hereunder. The following details are intended to aid in the understanding of the invention.

Figure 5A:
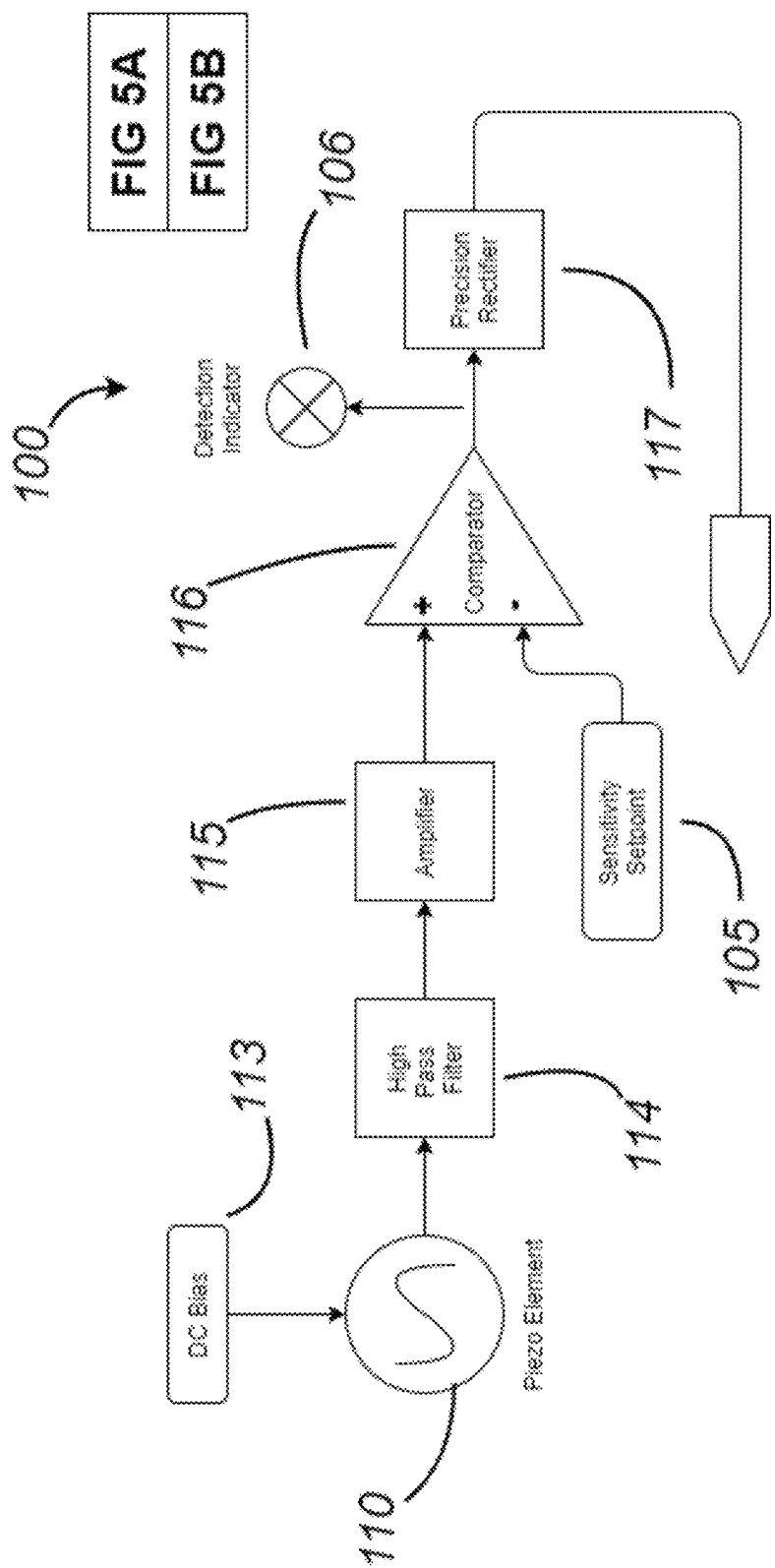
FIG. 5A is a partial flow diagram describing the nature of the embodiment of the present invention.
Figure 5B:
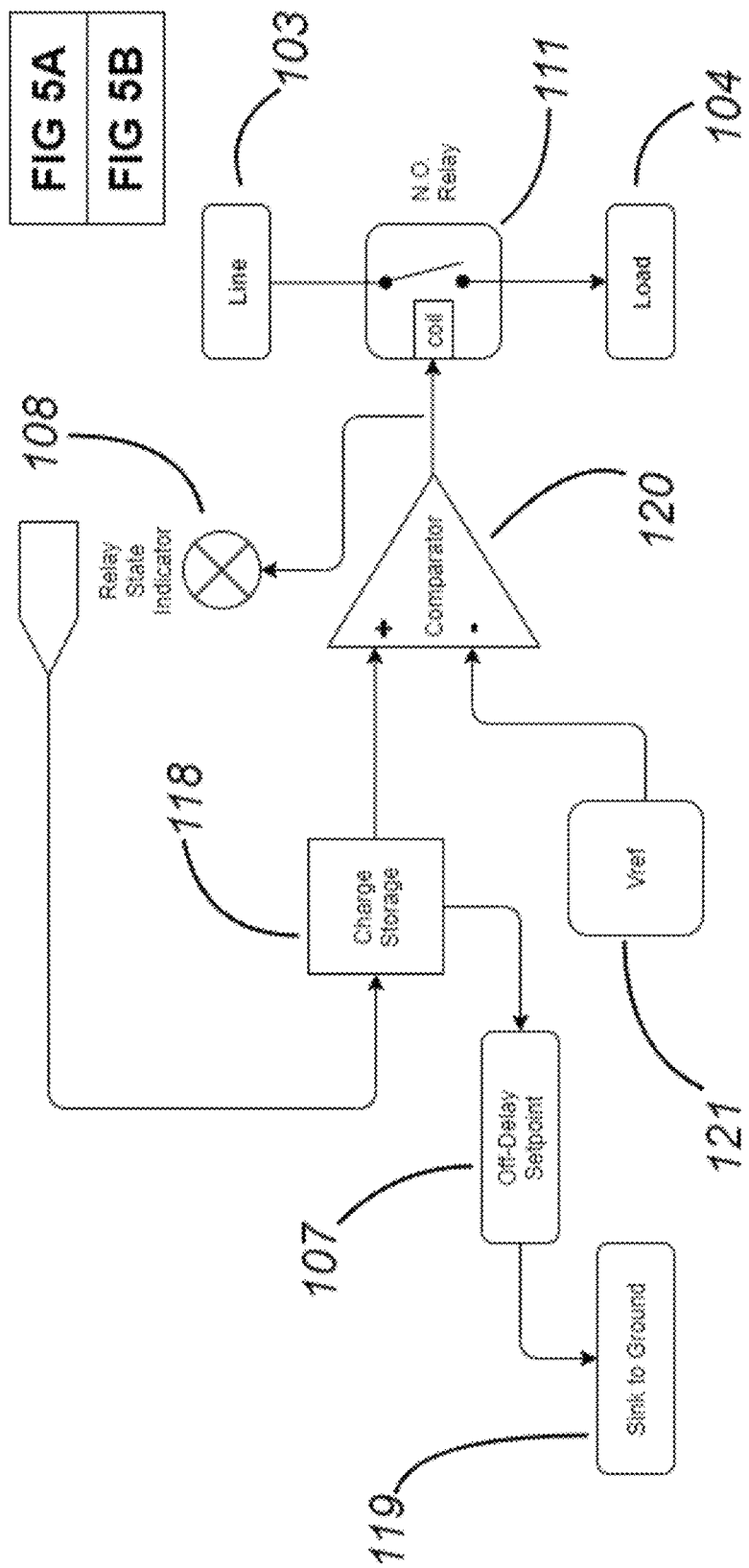
FIG. 5B is a partial flow diagram successive to the diagram described in FIG. 5A.
Figure 6:
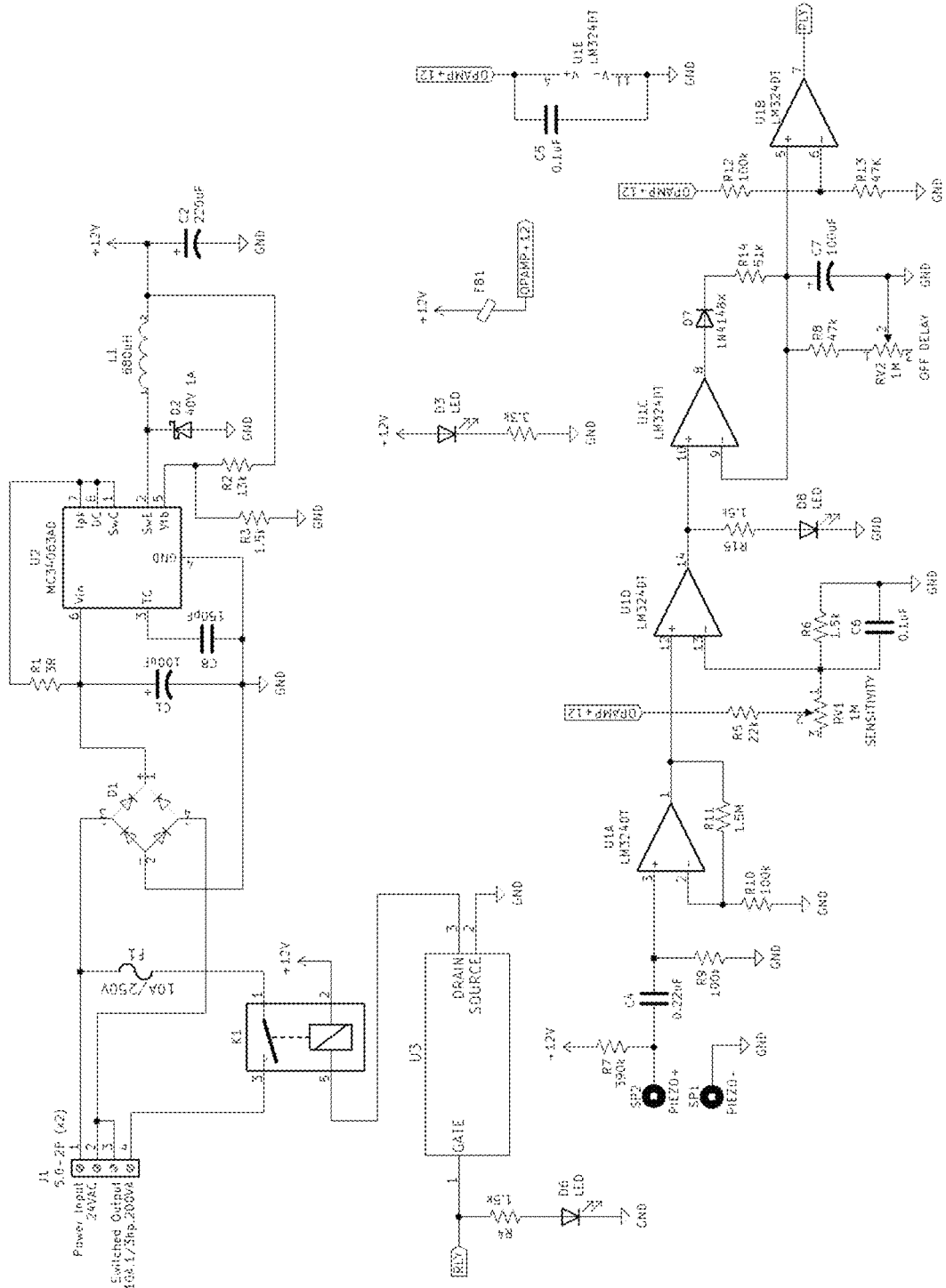
FIG. 6 is a schematic diagram of one implementation for an embodiment of the present invention.

Now referring to the drawings wherein like numerals refer to like structure shown in the drawings and text included in the application throughout. With reference to FIG. 6, there is shown a new and useful vibration sensor switch control circuit generally designated 109. The system includes numerous sub-sections, which are shown in enlarged detail in FIGS. 7-11. FIGS. 5A and 5B represent a higher-level flow diagram directed toward the embodiment of FIG. 6.

Figure 1:
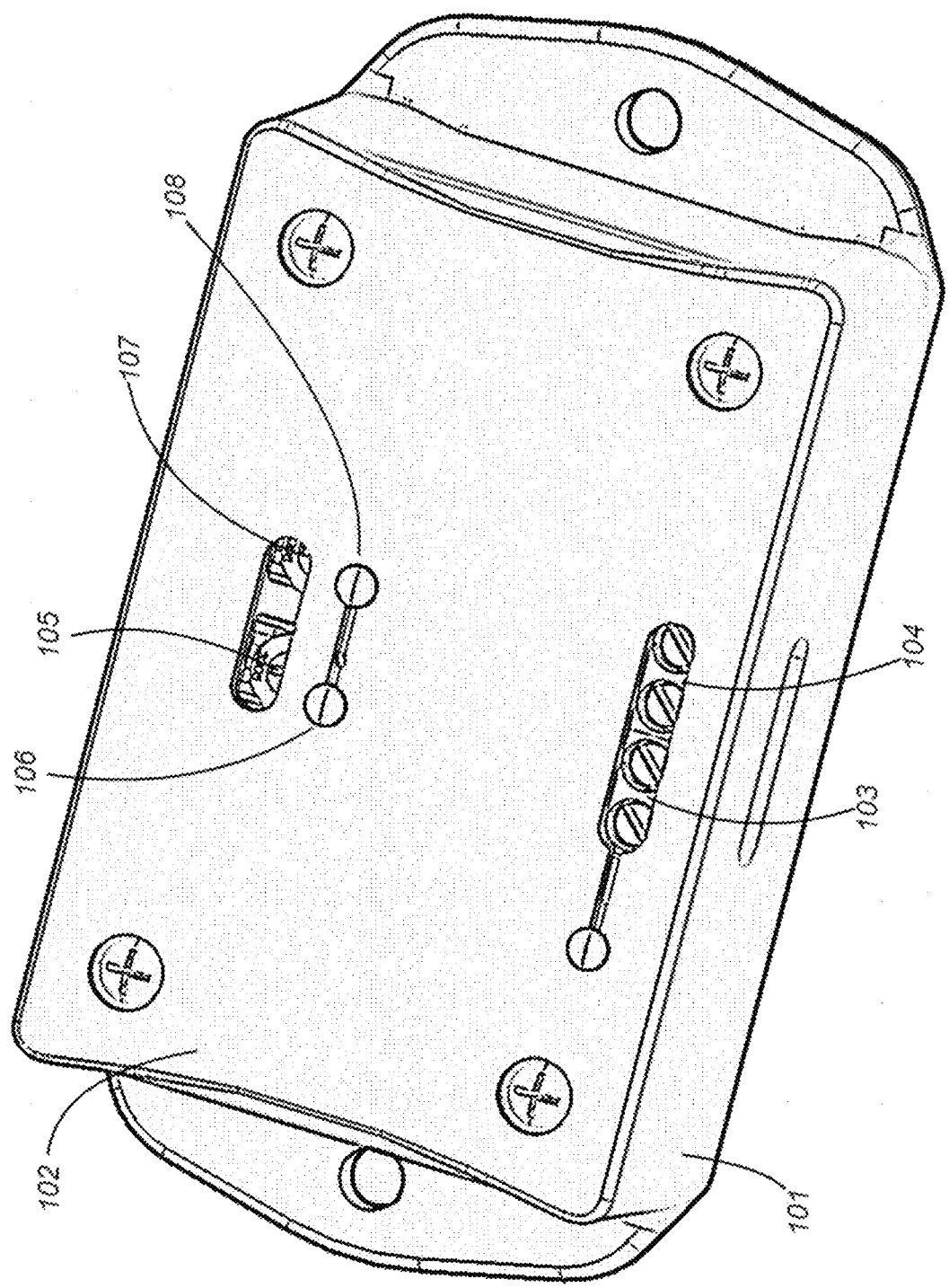
FIG. 1 is an embodiment of the present invention as a complete product.
Figure 2:
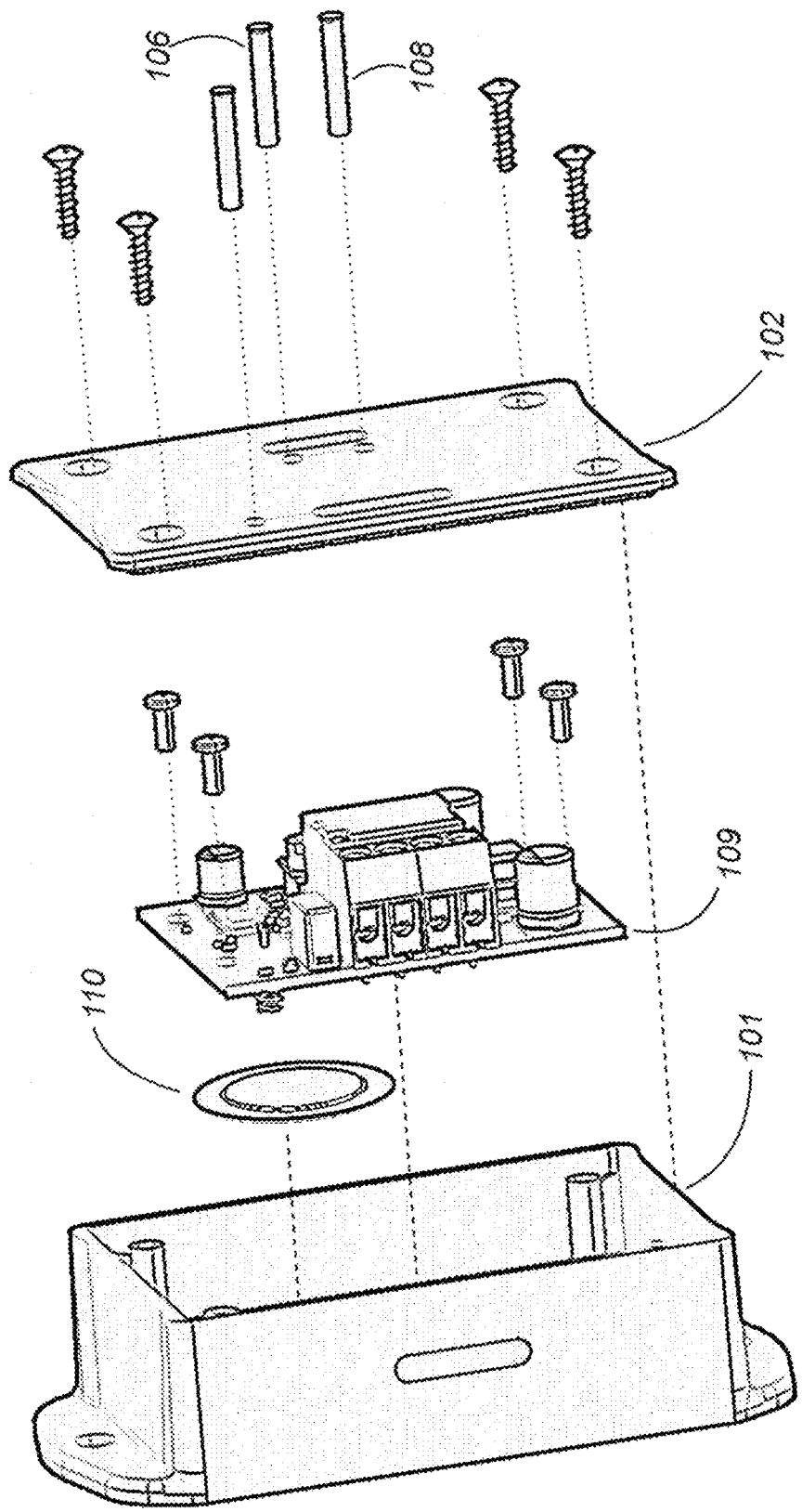
FIG. 2 is an exploded view of the components comprising the embodiment shown in FIG. 1.
Figure 3:
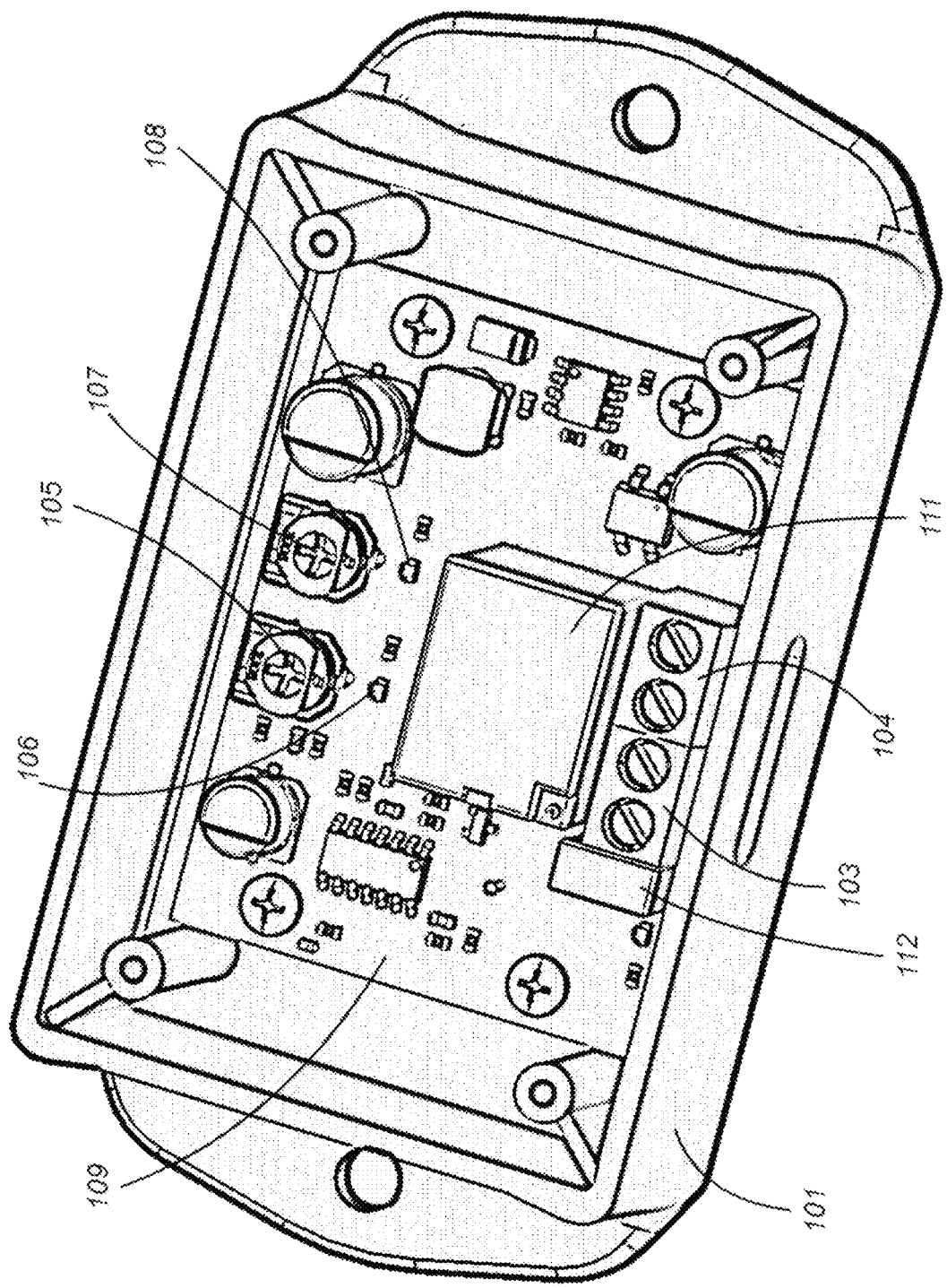
FIG. 3 is a view of one implementation of the printed circuit board and components required to execute the aforementioned objectives and comprise the features and operation explained prior to and subsequent to this section for an embodiment of the present invention.

Now referring first to FIGS. 1, 2, 12, 13, there is shown a vibration sensor switch generally designated 133 (FIGS. 12, 13) and control circuit 109 (FIGS. 2, 3, 4) which describes just one particular embodiment of the many embodiments of the present invention. This particular embodiment is focused on a vibration sensor switch 133 installed on a split system furnace 122 with the capability of controlling the operation of powered accessory devices; in this instance, determining the on/off state of an accessory system comprising: a humidifier 128 whose operation is controlled via a humidistat 129, where supply power to this system 130 is toggled on and off by the vibration sensor switch 133 powered by an external AC power source 132. For the purposes of this description, a split system is comprised of: a furnace 122, a filter box 124, a cased evaporator coil 123, a condenser 134 mounted outdoors, and a refrigerant line-set 135 transmitting the refrigerant between the condenser 134 and the evaporator coil 123. In one alternate configuration, the filter box 124 is integral to the furnace 122. In yet another alternative configuration, the evaporator coil may be uncased and installed inside the supply plenum 125. In yet another alternate configuration, the outdoor unit may be a heat pump. In yet another alternate configuration, the air delivery device may be a fan-coil or air handler rather than a furnace 122. In said configuration, the evaporator coil 123 is most generally integral to the air delivery device. The components of the split system denoted herein as well as any of the aforementioned alternate configurations may be used interchangeably to describe the HVAC system, or more particularly the motorized air delivery device to which it is intended for the present invention to be installed.

The vibration sensor switch 133 includes a lower housing 101 which doubles as the mounting means and an upper housing or lid 102. The upper housing has cutout features for a visual vibration detection indicator 106, access to a potentiometer 105 for adjusting the sensitivity of detection, a second visual indicator 108 that denotes the state of the relay 111, and access to a second potentiometer 107 for adjusting the off-delay or amount of time the relay remains closed after the vibration detection has ceased. The vibration sensor switch 133 also includes a control circuit 109 which includes several subsections, which are shown in FIGS. 5A and 5B and will be discussed in depth below. The subsections include, but are not limited to, means to detect vibration 110, means to provide a DC bias 113 to the detector, a high-pass filter 114 to remove the DC offset, an amplifier 115 to boost the signal obtained from the detector 110, a comparator 116 that compares this amplified sensor signal with a sensitivity setpoint 105, a detection indicator 106 driven by the comparator 116 that is activated any time the sinusoidal amplifier output voltage is greater than said setpoint 105, a precision rectifier 117 to allow the comparator 116 output to source current from the positive power supply rail but prevent the comparator 116 from sinking current to the negative or ground power supply rail, a device for charge storage 118 that derives its input from the rectifier 117, an off-delay setpoint adjustment 107 that will bleed voltage from the charge storage 118 via a sink to ground 119 connection, a second comparator 120 that compares this charge storage 118 voltage to a reference voltage 121 thereby providing an off-delay as the charge storage 118 voltage is bled via the off-delay setpoint 107 and sink to ground 119 in lieu of continuous input from the precision rectifier 117, a relay state indicator 108 driven by the second comparator 120 that is activated any time the voltage in the charge storage 118 is greater than the reference voltage 121, a normally-open relay 111 that indirectly derives its coil voltage from the output of the second comparator 120, a 2-position line power terminal block 103 (FIGS. 1 and 3) that supplies the line power to the connected load via a second 2-position load terminal block 104 (FIGS. 1 and 3), and a fuse 112 to provide over-current protection for the contacts of the relay 111.

Figure 4:
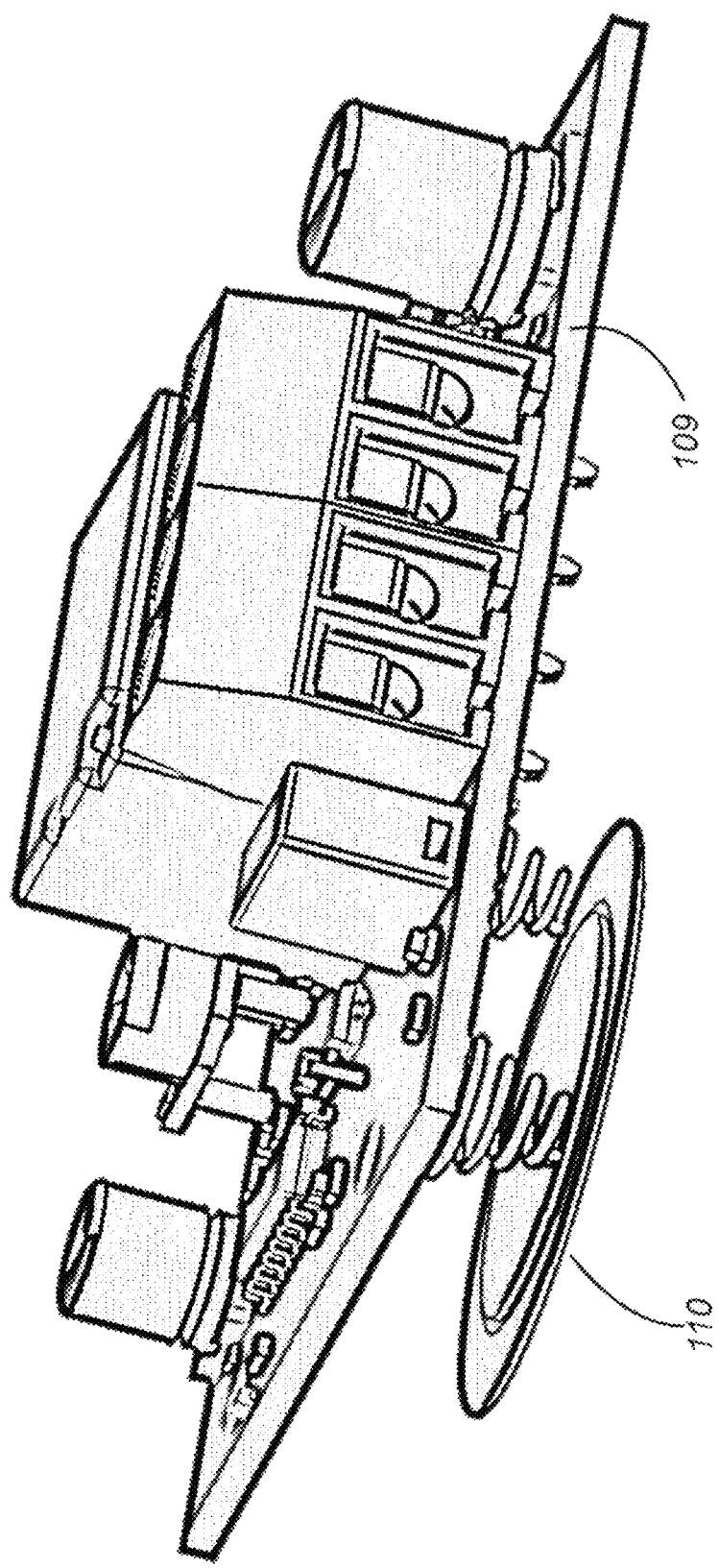
FIG. 4 is an alternate view of the implementation described in the paragraph above that shows the piezo sensing element which has been obscured by other components in the preceding figures.

The means to detect vibration 110, does not require an accelerometer, a strain gauge, a coiled spring vibration switch, an eddy-current sensor, or mass-loaded piezoelectric cantilevered film sensor. Instead, a piezoelectric element is used. This electroacoustic element is designed to convert electrical energy into mechanical energy (e.g.: sound waves). The converse is also true: imparting mechanical energy into a piezoelectric element will generate electricity. With invariable strain or force, this electrical signal will take form of a DC voltage proportional to the strain or force. With an oscillating energy source (e.g.: sound or vibration), this electrical signal will take the form of a sinusoidal alternating voltage. The diaphragm or substrate of the piezoelectric element is constructed of a brass, steel, or nickel alloy. A piezoelectric ceramic material is deposited in the center of this diaphragm. The ceramic forms one terminal of what is, in this configuration, the positive output signal; the metal diaphragm forms the negative terminal. This piezo-electric transducer 110 may not have a housing as depicted in FIG. 4; in which case it can be remote to the printed circuit board, connected to the circuit via soldered wires, springs, or other conductive elements. Alternately, this piezo-electric transducer 110 may be encased in a plastic housing with wire leads or tabs for thru-hole or SMT soldering, respectively. In the implementation of the embodiment shown in FIG. 4, an unhoused transducer is shown. This type of piezoelectric transducer was chosen for the benefit of lower cost, larger diameter and thus greater sensitivity at lower frequencies, and a degree of interchangeability with respect to the printed circuit board that is advantageous over an encased transducer directly soldered to the PCB. A complete understanding of this embodiment can be obtained by referring to FIGS. 5A and 5B in conjunction with FIGS. 6, and 7-11, and their associated text. The prior discussion of FIGS. 5A and 5B is intended to provide an overview of the vast detail provided in FIGS. 6-11.

Figure 12:
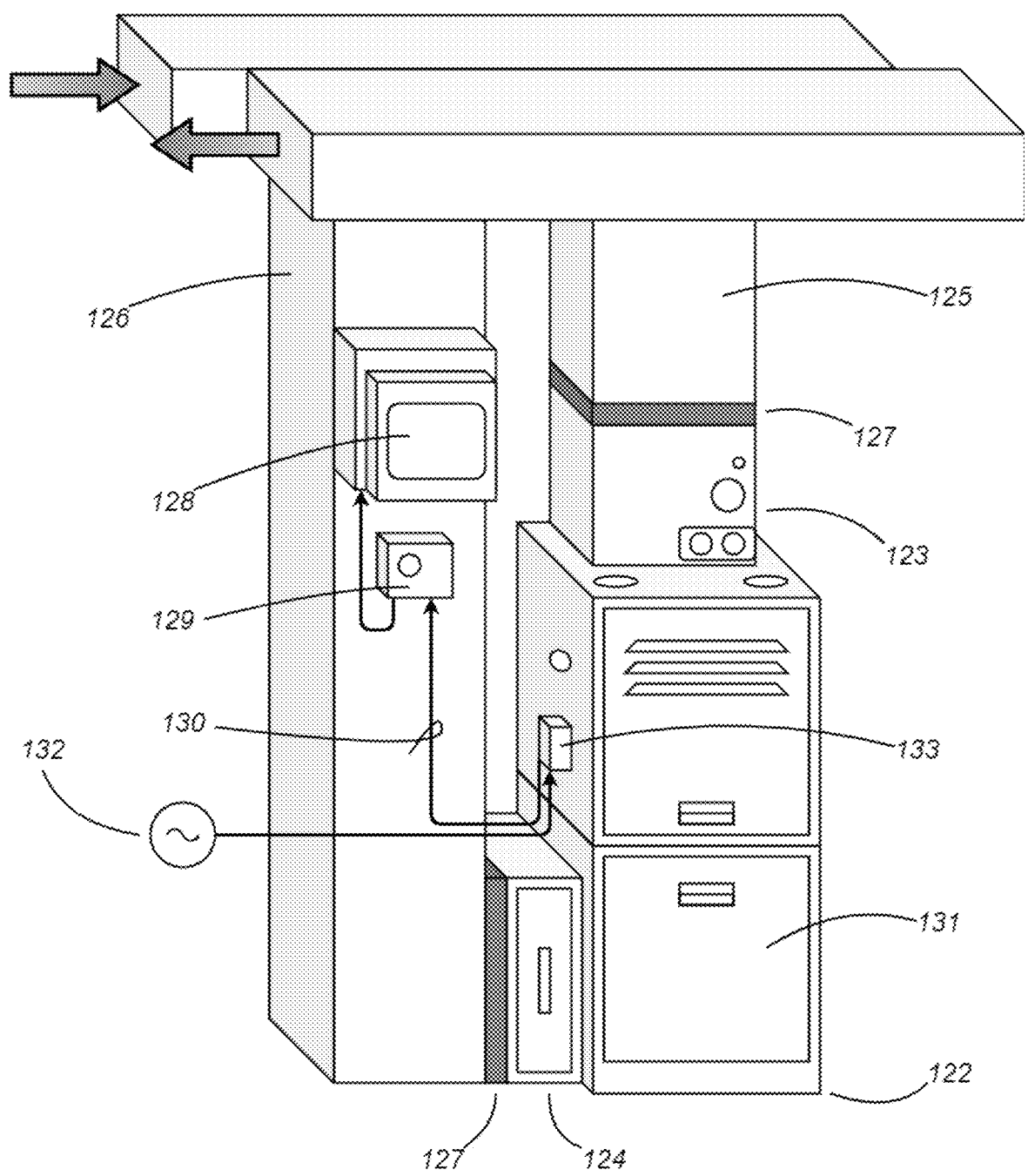
FIG. 12 is a view of a typical use-case for the product shown in FIG. 1 which is an embodiment of the present invention.

Now referring to FIG. 12, there is shown an overview of the system of the present invention, which included furnace 122, evaporator coil 123, supply plenum 125, filter box 124, humidifier 128, humidistat 129, humidifier/humidistat power source wire 130, vibration sensor switch 133, and A/C power source for said switch 132. This system also includes a return plenum 126 from which the conditioned air delivered to the living space returns to the furnace 122. The return plenum is often where the powered accessory device mounts to or is connected to via supplemental ductwork. This system may also include flexible duct connectors 127 on one or both of the supply and return plenums. These flexible duct connectors 127 are incorporated into the system to reduce the transmitted vibration from the furnace's 122 blower wheel/motor assembly located in the blower compartment 131. It is important to note the existence of such isolation devices as it will impede the efficacy of the vibration detector if the vibration sensor switch 133 is not located within the section of the HVAC system bounded by said isolators.

Figure 13:
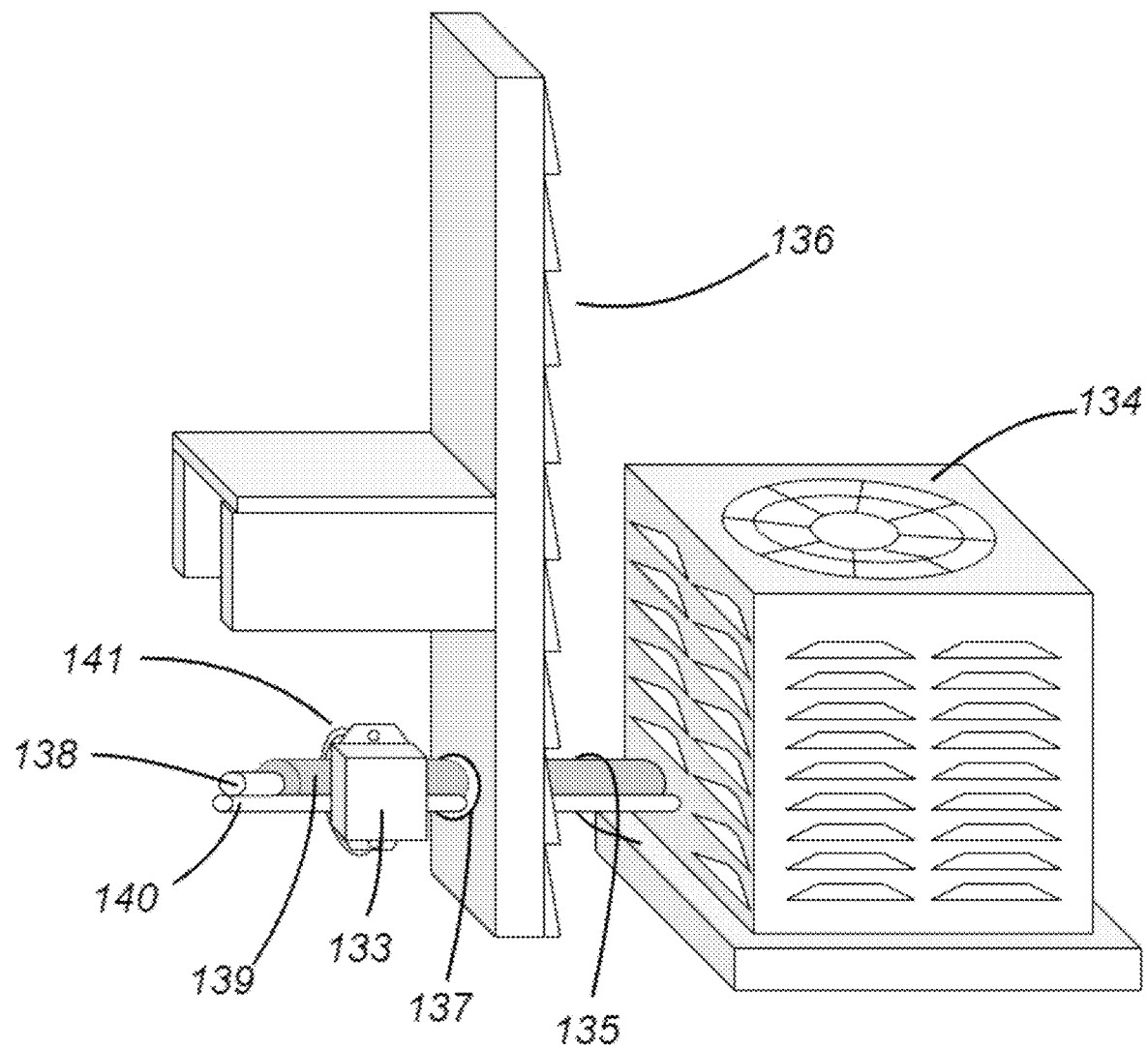
FIG. 13 is a view of an alternate use-case for the product shown in FIG. 1.

Now referring to FIG. 13, there is shown the outdoor components remote but essential to the system of the present invention, which included air conditioning condenser unit 134 and refrigerant line-set 135. This set of copper tubes forms a closed-loop system between the evaporator coil and the condensing coil. This refrigerant line-set is comprised of a small diameter copper tube 140 that carries the high-pressure liquid refrigerant from the outdoor condenser coil to the metering device that precedes the evaporator coil in the system, and a larger diameter copper tube 138 that carries the low-pressure vaporized refrigerant from the indoor evaporator coil to the compressor that precedes the condensing coil inside the air conditioning condenser unit 134. This vapor tube 138 or "suction line" is always insulated with a closed cell elastomeric tube insulation 139 to prevent the vapor within the tube from gaining enough energy from peripheral heat sources such that it may condense into a liquid prior to the compressor, thus decreasing efficiency and shortening the lifespan of the compressor. In typical installations, the liquid tube 140 is often bound to the tube insulation 139 in several places. A necessary feature of the bound line-set 135 is the manner in which it penetrates the building envelope. The interior diameter of the hole 137 that is made in the exterior wall 136 is larger than the overall cross-sectional area of the liquid tube 140 and the tube insulation 139 that surrounds the vapor tube 138. As a consequence, the gaps in this exterior penetration must be sealed with what is customarily a non-hardening sealing compound. The compressor within the outdoor condenser unit cabinet is often mounted with isolators to lower the transmission of vibration to the condenser unit chassis. However, both of the copper refrigerant lines are directly connected to the compressor or the condenser coil which is, in turn, connected to the compressor via the "discharge" copper tube. The locations in which the refrigerant lines penetrate the chassis of the condenser unit are also isolated to prevent galvanic corrosion between the steel chassis and copper refrigerant lines. The propensity for the compressor to exhibit vibration while in operation, together with the refrigerant lines' isolation from both the chassis and exterior wall penetration will necessarily result in the transmission of vibration from the compressor to the refrigerant line-set 135, even after it enters the building envelope. Therein lies the opportunity for the alternate use-case for the vibration sensor switch 133 shown in FIG. 13. If the vibration sensor switch 133 is mechanically coupled to the refrigerant line-set 135 via a clamp 141 or similar mechanism, the switch will sense the operation of the compressor and therefore, the operational state of the air conditioning condenser unit. Installed in this manner, the vibration sensor switch 133 will control the operation of an HVAC accessory device only when the system is operating in air conditioning mode. This is in contrast to the typical use-case shown in FIG. 12 in which the vibration sensor switch 133 will control the operation of an HVAC accessory device irrespective of the system operating mode (heating or cooling).

Now referring to FIGS. 6 and 7-11, the circuit details of one embodiment of the invention are shown.

Figure 7:
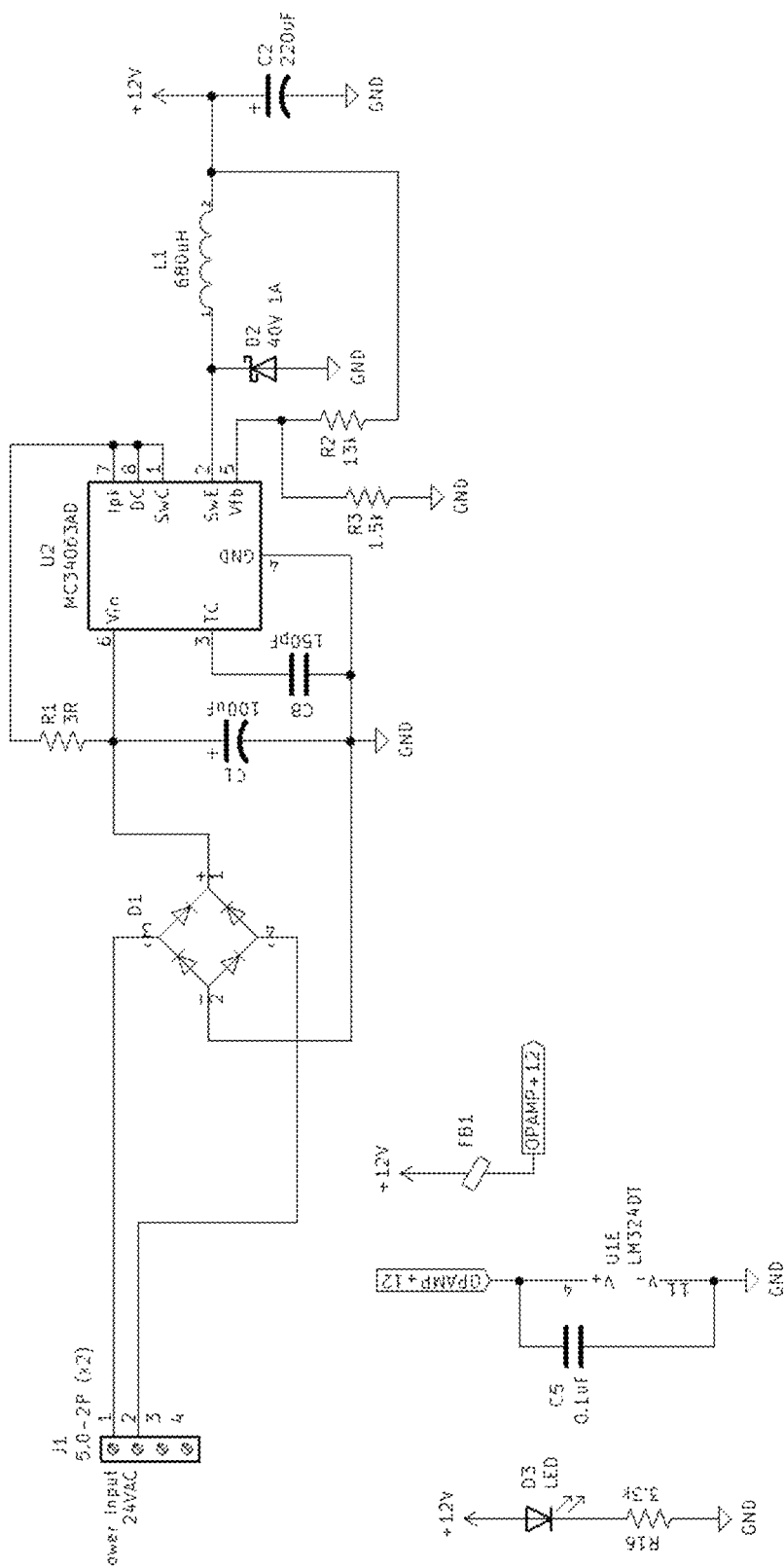
FIG. 7 is an enlarged view of a representative portion of the circuit of FIG. 6.

FIG. 7 shows the 24-volt AC power input via positions 1 and 2 of terminal block J1. The AC voltage first encounters a full bridge diode rectifier D1. Once this rectified but unregulated voltage is placed across C1, a 100 µF electrolytic capacitor, a low-ripple DC output voltage is available to the next stage of the power supply. The average no-load output of a bridge rectifier is calculated as $Vdc=(2*(Vac\{rms\}*\sqrt{2}))/\pi=(2*(24\ V*1.414))/3.1415=21.60$ volts DC. Although, with the inclusion of capacitor C1, the no-load voltage is closer to the Vp-p value of the input: $Vp\text{-}p=Vrms*\sqrt{2}=24\ V*1.414=33.94$ volts DC. This is important to note when selecting the voltage rating of capacitor C1 as well as the maximum input of the voltage regulator or switching IC that follows.

Voltage regulator IC's and Zener diodes are, by definition, low-efficiency devices. They drop the input voltage down to the regulated supply voltage for the circuit by dissipating the excess voltage in the form of heat. In this case, that would mean dropping an input voltage of close to 34 volts DC down to 12 volts DC. The heat generated by such a large voltage drop is unacceptable for the purposes of this circuit. Instead, this circuit uses a switched-mode power supply (SMPS). An SMPS has a much higher efficiency and generates little heat in the process. To control this SMPS, integrated circuit U2, an MC34063AD is chosen. This is a buck/boost regulator configured in the buck, or voltage dropping mode. The datasheet of U2 provides calculations to arrive at the values of each component connected to the IC. R1, a 3Ω resistor, connects pins 1, 7, 8 to pin 6. Pin 6 is the input voltage pin, so R1 is the input current sensing resistor.

A 150 µF capacitor is connected from ground to pin 3, or the "TC" terminal. The value of this capacitor determines the frequency with which the SMPS operates. The value of this C8 capacitor was chosen to drive the U2 IC at its maximum frequency of 100 kHz. Keeping the switching frequency high allows for smaller components to be used on the output section of the SMPS. It is important to select a C8 capacitor with a small tolerance (±1% or better) and a good temperature coefficient (C0G/NP0). This will serve to keep the frequency stable which will help to both keep the output stable as well as allow the selections of filtering or decoupling devices elsewhere in the circuit to perform as designed. The output on pin 2 of U2 is connected in series with inductor L1 which has a value of 680 µH. The output of L1 is coupled to ground via a 220 µF electrolytic capacitor, C2. L1 and C2 form the output filtering section of the SMPS and their values are chosen for the given output voltage and current consumption of the circuit. Between pin 2 and L1, there is a diode D2. D2 protects the output pin of U2 and is rated for a peak-inverse voltage of 40 volts and a current of 1 amp. D2 dissipates the flyback energy when the L1 inductor is switched off (100,000 times per second). The final stage of the SMPS is the output feedback loop. This loop is sampled from the node between the L1 inductor and C2 capacitor, this node effectively being the output of the SMPS. The feedback loop is connected to pin 5 of U2 via a voltage divider with the central node of the divider connected to pin 5. R2 and R3 form this voltage divider. R2 on the 'high' side of the divider is rated at 13 kΩ and R3 on the 'low' side of the divider is rated at 1.5 kΩ. These values, like the other component associated with the SMPS are dictated by the calculations from the MC34063AD datasheet. In this case, the output voltage given the values of R2 and R3 calculates to 12.08V. To maintain a stable voltage, R2 and R3 must have a very good tolerance. The bill of materials for this circuit lists these two resistors as requiring a tolerance of ±0.1%.

FIG. 7 also shows an LED, D3. The anode of D3 is connected to the +12V supply rail and the cathode connects to current-limiting resistor R16. R16 is rated 3.3 kΩ and is connected to ground. As configured, LED D3 indicates that power to the circuit is present. A ferrite bead, FB1 is shown connecting to the +12V supply rail and provides filtered power to the operational amplifier and related components. The selection of FB1 should be appropriate to effectively filter the noise imparted to the circuit from the SMPS. The power supply pins 4 and 11 of the LM324 integrated circuit U1 are shown to be powered by this filtered subset of the 12-volt supply noted by the global label "OPAMP+12" in the circuit diagrams. Additionally, U1 has a 0.1 µF decoupling capacitor across supply pins 4 and 11. This too helps to provide clean input power to the operational amplifier.

Figure 8:
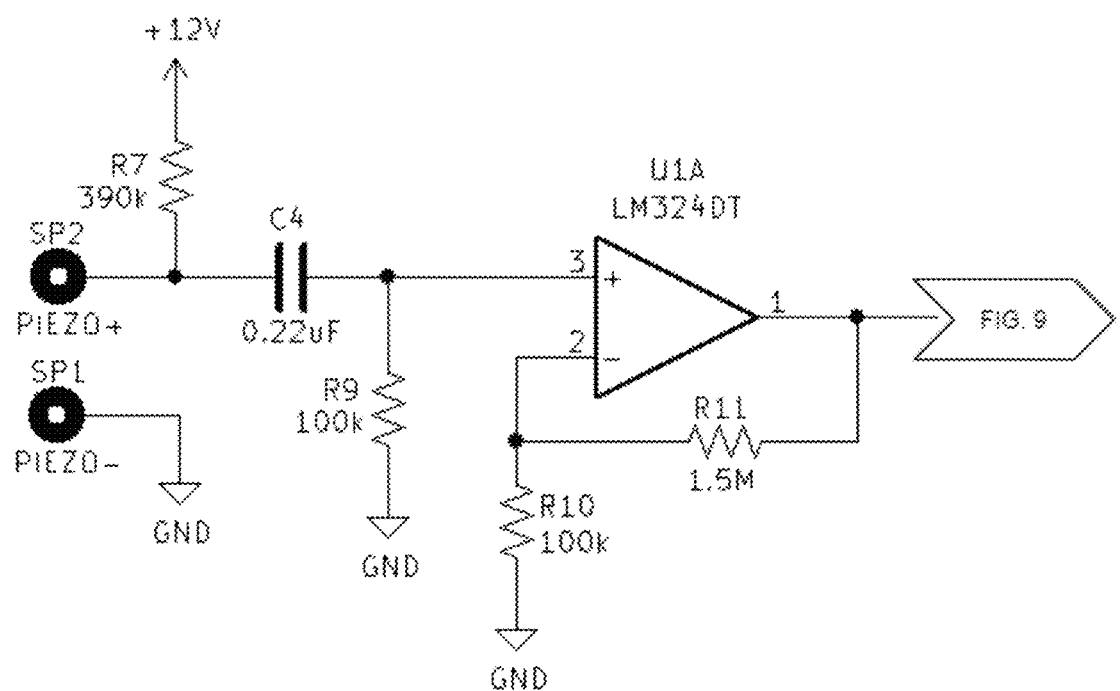
FIG. 8 is an enlarged view of a representative portion of the circuit of FIG. 6.

FIG. 8 shows the connections for the piezo element PZ1. These connections are springs soldered to the PCB that make contact with either the positive ceramic element or the negative diaphragm once the PCB is mounted with the piezo element beneath. The negative spring is tied to ground and the positive spring is connected to the +12V supply rail to bias the piezo element. This bias is accomplished through a 390 kΩ resistor R7. The value of this resistor is dependent on the selection of PZ1, but its purpose is to raise the overall voltage of the entire sinusoidal output wave produced by PZ1 in the presence of vibration. Since PZ1 and the amplifier that follows are operating from a single-ended power supply and the negative pin of PZ1 is connected to ground, only half of the sinusoidal wave would be presented to the amplifier were it not for this DC bias or upward shift in composite voltage imparted to the output wave. The biased sinusoidal output is next fed to a series 220 nF capacitor, C4, which will eliminate the DC offset. 100 kΩ resistor R9 keeps the non-inverting input at pin 3 of U1a at ground potential in the absence of a signal from capacitor C4. C4 together with R9 also form a passive first-order high-pass filter. The cutoff frequency of this filter is given as: fc=1/(2πRC)=1/(2*π*100 kΩ*220 nF)=7.2 Hz. It is to be expected that any single-phase motorized device to exhibit its largest amplitude of vibration at 60 Hz with smaller amplitudes at each harmonic thereof.

Following the high-pass filter is the first of four operational amplifiers in the LM324 integrated circuit, designated U1a. The non-inverting input at pin 3 is where this connection takes place. The inverting input at pin 2 is tied to ground via another 100 kΩ resistor R10. Pin 2 is also connected to pin 1 via 1.5MΩ feedback resistor R11. The voltage divider consisting of R10 and R11 forms a negative feedback loop and configures this op amp as a non-inverting amplifier. The closed-loop gain of this amplifier is given as: A(v)=1+(Rf/R2)=1+(1.5MΩ+100 kΩ)=16.

Figure 9:
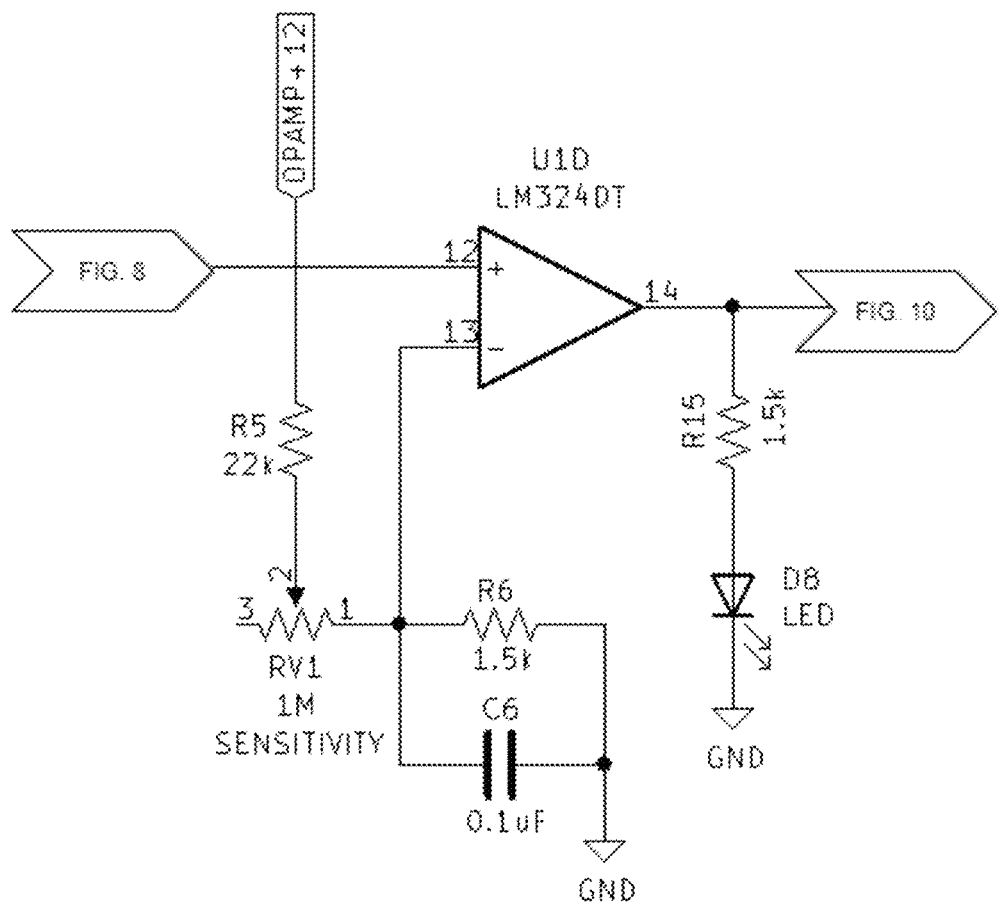
FIG. 9 is an enlarged view of a representative portion of the circuit of FIG. 6.

FIG. 9 shows the fourth of four operational amplifiers in the LM324 IC, designated U1d. This op amp is in an open-loop configuration and is thus configured as a comparator. If the voltage at the non-inverting input is greater than the voltage at the inverting input, the output will swing high (close to 12 VDC). If the voltage at the non-inverting input is less than the voltage at the inverting input, the output will swing low (close to 0VDC). The non-inverting input on pin 12 is fed by the op amp stage described previously. The inverting input on pin 13 is connected to a voltage divider network to provide a Vref to the comparator. This network consists of 22 kΩ R5, 1.5 kΩ R6 and 1MΩ potentiometer RV1. R5 connects a filtered node of the +12 VDC power rail to the wiper of RV1. Pin 1 of RV1 is connected to pin 13 of op amp U1d. R5 along with the variable resistance of RV1 form the 'high' side of the voltage divider or Z1 in the standard equation. The 'low' side of the voltage divider, or Z2 in the standard equation, consists solely of R6 which connects pin 13 of op amp U1d to ground. In this configuration, the Vref provided to pin 12 of op amp as the comparator's reference voltage has a minimum of: Vmin=Z2/(Z1+Z2)*Vin=(1.5 kΩ/((22 kΩ+1MΩ)+1.5 kΩ))*12V=17.5 mV. The Vref has a maximum of: Vmax=Z2/(Z1+Z2)*Vin=(1.5 kΩ/(22 kΩ+1.5 kΩ))*12V=766.0 mV. Given the nature of the load on this U1d op amp, no feedback path from the output to the non-inverting input was used to provide hysteresis. However, 0.1 μF capacitor C6 is placed across R6 to help mitigate the effect of noise on the comparator.

Before the output on pin 14 is fed to the next section, it is first used to indicate the sensed vibration with respect to the sensitivity setpoint. This indication is done with LED D8. D8 is current-limited by 1.5 kΩ R15. Due to the nature of the expected 60 Hz vibration frequency, this LED should flicker at a rate that is imperceptible to most observers once approaching the setpoint. In fact, this is used as the means for calibrating the sensitivity once the vibration sensor switch is installed. Potentiometer RV1 is initially set such that the Vref on pin 13 is at a maximum value. The potentiometer is slowly rotated. As the comparator begins to affirm the setpoint crossings with perceptible flickers of the D8 LED, this is an indication that the larger, transient vibratory magnitudes are within the range of the setpoint. As the User continues to turn the potentiometer, the flicker should become more constant as the setpoint crossings become more consistent. The point where the User can no longer perceive the flicker is the point in which the sensitivity adjustment potentiometer RV1 is set such that an appropriate threshold Vref is present on the comparator's pin 13.

Figure 10:
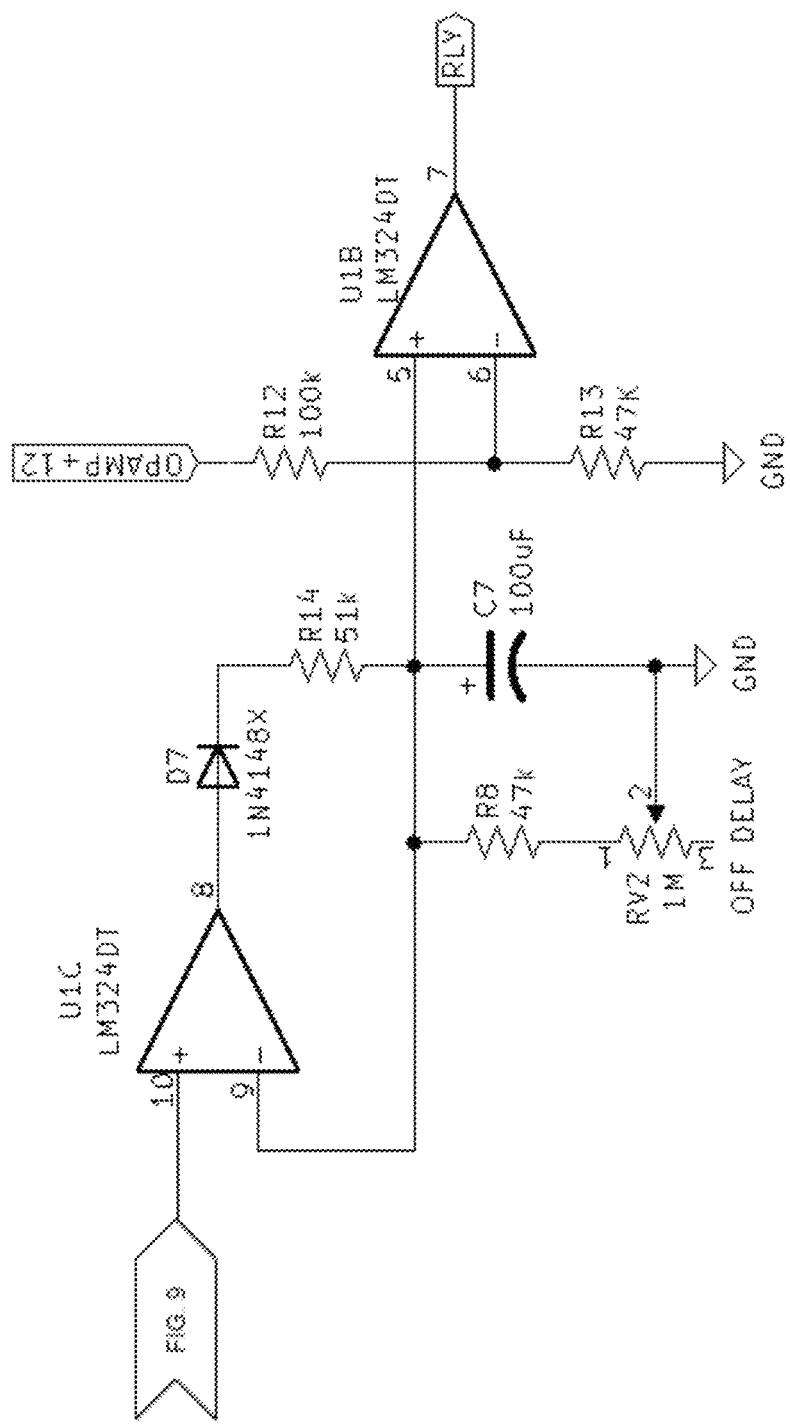
FIG. 10 is an enlarged view of a representative portion of the circuit of FIG. 6.

FIG. 10 shows the third of four operational amplifiers in the LM324 IC, designated U1c. With the output pin 8 being effectively fed back into the inverting input pin 9, notwithstanding the other components in this feedback loop, this op amp can be thought of as follower or buffer. The output voltage on pin 8 should be equivalent to the input voltage on non-inverting input pin 10. With addition of the D7 signal diode which is forward-biased and fed from the output pin 8, this section can now be thought of as a precision rectifier. When the output on pin 8 is high, the output after diode D7 is also high. When the output on pin 8 is low, the D7 diode will prevent any other components connected to this loop from being pulled to ground potential. A diode acting independently will exhibit a voltage drop due to the internal junction resistance, typically 0.7 volts. Inserting that same diode into the feedback loop of a unity gain op amp follower as shown in FIG. 10 will compensate for that loss. For example, if the voltage on non-inverting pin 10 is 4.0V, the voltage at the output pin 8 would also be 4.0V were this a standard op amp buffer. With the diode voltage drop included in the system, the output being fed back to the non-inverting input pin 9 would be 3.3V (4.0−0.7). Since a fundamental precept of operational amplifiers is that the output attempts to do whatever is necessary to keep the difference in voltage between both input pins at 0; and in this example pin 10's input is 0.7V higher than pin 9's input, so the output on pin 8 will be higher than its expected value of 4.0V. It will increase in value until the voltage on pin 9 is equivalent to the voltage on pin 10. So, the output of pin 8 in this example would be 4.7V. After the diode drop imparted by D7, the output of this rectifier now matches the input on pin 10 of 4.0V. With this 4.0V feedback being fed to pin 9, the op amp inputs are once again at equilibrium. So, a precision rectifier can be thought of as a simple diode rectifier with compensation for its voltage drop.

The inclusion of a 100 μF electrolytic capacitor, C7, which connects the feedback loop of U1c to ground once again alters the configuration of this op amp. It is now considered a peak detector. When the input on pin 10 increases, the voltage across C7 increases a commensurate amount. For an ideal peak detector, once the input on pin 10 decreases and D7 does not allow C7 to discharge, the previous peak voltage should remain across the capacitor. A typical op amp peak detector will immediately charge the capacitor until its voltage is equivalent to the input voltage on pin 10 less some signal loss internal to the op amp stage. This fast transition of voltage may result in an instantaneous current draw from the op amp's output that exceeds the rating of the chip. So, a resistor is placed between the diode D7 and capacitor C7. Acting alone, this resistor will not affect the voltage through the feedback loop, but it will slow the rate of rise any time the capacitor charges. Given an R14 value of 51 kΩ and a C7 value of 100 μF, the time constant of this resistor-capacitor network, is given as: τ=RC=(51 kΩ*100 μF)=5.1 seconds. This is the amount of time it takes for the voltage across capacitor C7 to reach 63.2% of the full charge. To discharge the capacitor C7, a second potentiometer, RV2 is used. This 1MΩ potentiometer is placed across the capacitor in series with a 47 kΩ resistor, R8, that sets the minimum time it takes to discharge the capacitor.

The second of four operational amplifiers on the LM324 chip designated U1b is shown with its non-inverting input on pin 5 connected to the aforementioned precision regulator and peak detector comprised of U1c, D7, and C7. U1b's inverting input on pin 6 is connected to the center of a resistor voltage divider. In this open-loop configuration, U1b is also a comparator with the reference voltage on pin 6. The reference voltage is provided by resistors R12 and R13. R12 is a 100 kΩ resistor connected to a filtered node of the +12 VDC power rail. R13 is a 47 kΩ resistor connected to ground. The voltage in the central node of this divider is: Vref=Z2/(Z1+Z2)*Vin=47 kΩ/(100 kΩ+47 kΩ)*12=3.84 volts. So, comparator U1b's output pin 7 will swing high when the voltage on pin 5 is >3.84 volts. Otherwise, the output will remain low.

Since the source of the voltage on pin 5 is a capacitor charged by a precision rectifier with a variable resistance draining the capacitor in the absence of output voltage from said rectifier, this section of the circuit comprised of U1c and U1b can be thought of as an "off delay". Potentiometer RV2 will determine the time it takes for comparator U1b to go low on its output pin 7 once the input to U1c on pin 10 ceases. The formula for calculating the elapsed time for a capacitor to discharge via a resistor from a starting charged voltage, Vc, to a specific discharged voltage, Vd, is: t=−RC*ln (Vd/Vc). Given that Vc is equivalent to the +12 VDC rail minus 2 stages of internal op amp losses and Vd is the U1b threshold voltage of 3.84, we can determine the minimum and maximum off delay that can be obtained by varying RV2.

It is important to consider that although R14 and R8 appear to be in a voltage divider arrangement, the voltage at their central node will be much higher than calculated. That central node is connected to the inverting input of U1c and is therefore always driven to the voltage present on the non-inverting input pin 10. We can expect this voltage to be approximately 11.7 volts after the internal voltage drops of the previous 2 op amp stages are taken into consideration. So, the voltage across the capacitor prior to the discharge cycle should be expected to be approximately 11.7 volts. R14 serves no purpose when C7 is discharging. When RV2 is at a minimum, the minimum time required to discharge the capacitor below the threshold is given as: t=−RC*ln(Vd/Vc)=−47 kΩ *100 µF*ln(3.84V/11.7V)=5.24 seconds. When RV2 is at a maximum, the maximum time required to discharge the capacitor below the threshold is given as: t=−RC*ln(Vd/Vc)=−1.047MΩ*100 µF*ln(3.84V/11.7V) =116.65 seconds. The range of off delay adjusted by potentiometer RV2 is therefore approximately 5 seconds to 2 minutes.

One advantage of using this peak detector+comparator arrangement is that if at any time during the discharge cycle of capacitor C7, vibration is once again detected thus presenting a high signal at pin 10, the capacitor will quickly charge back up to its prior peak value. This prevents temporary lapses in sensed vibration from deactivating the switch given an adequate setting for the off delay on RV2. The other advantage of this arrangement is that it also imparts an "on delay" to the circuit as well. When vibration is present and C7 begins to charge via R14, a period of time elapses before the voltage across the capacitor (connected to pin 5 of U1b) is greater than the Vref on pin 6 of U1b. The formula for the time required to charge a capacitor from 0V to a Vref of 3.84 volts, is given as: t=ln((Vs−Vc)/Vs) *R*C=ln((11.7V−3.84V)/11.7V)*51 kΩ*100 µF=2.03 seconds. The circuit will therefore require approximately 2 seconds of continuous vibration before the output at pin 7 of U1b goes high. This helps to prevent the occasional isolated disturbance detected by the piezo element from triggering the connected device. The relay contacts will close only if the sensed vibration is continuous.

Figure 11:
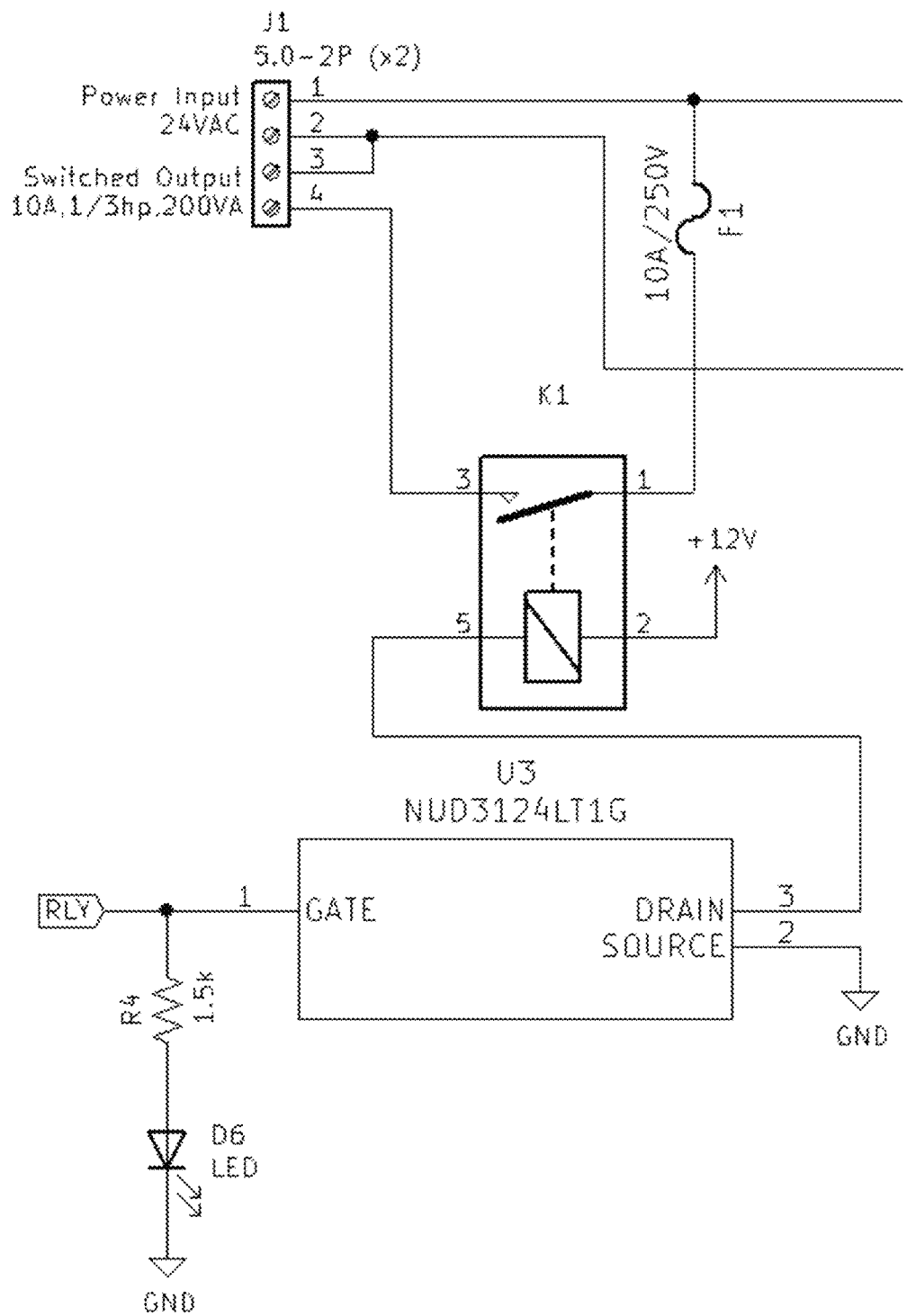
FIG. 11 is an enlarged view of a representative portion of the circuit of FIG. 6.

FIG. 11 shows the final stage of the circuit. Once the output on pin 7 from U1b goes high, LED D6 is lit to indicate operation of the connected device. The current to D6 is limited by the 1.5 kΩ R4 resistor. The output from pin 7 also feeds the U3 150 mA N-channel inductive load driver which controls the K1 relay. This single component has an internal Mosfet, diode, and resistor configuration that eliminates the need for external parts commonly associated with driving an inductive load from a logic-level signal. The K1 relay has an SPST or single-pole single-throw contact arrangement that is normally-open. That is to say that the contacts of K1 are open when unpowered and closed once the energized coil pulls the switched contacts together. Ultimately, pin 7 from Operational Amplifier section U1b controls the state of this relay, with U3 serving some compensatory and protective functions between the components.

The common terminal of the relay is powered directly from the power source to the present invention at terminal 1 of the J1 terminal block via a 10-amp fuse, F1. The normally-open terminal of the relay is connected to terminal 4 of the J1 terminal block. Terminal 3 of the J1 terminal block is powered directly from the power source at terminal 2 of J1. Positions 3 and 4 on the J1 terminal block are considered the switched AC output of the present invention.

FIG. 6 shows the relationships between the information shown in FIGS. 7-11 and the associated text.

Although the invention has been described in detail in the foregoing only for the purpose of illustration, it is to be understood that such detail is solely for that purpose and that variations can be made therein by those of ordinary skill in the art without departing from the spirit and scope of the invention as defined in the following claims, including all equivalents thereof. For present invention could be utilized in a 120-volt AC system for general appliance control instead of a 24-volt AC system specific to HVAC applications described herein. In a 120 volt AC system, there would be an integral power cord and integral NEMA 5-15R power socket in lieu of terminal block connections, as well as the addition of a means to step the 120 volt AC power down to 24 volts or lower prior to the rectifier section of the power supply. Alternatively, this 120-volt AC vibration sensor could be arranged such that the 120V power input plug and relay-controlled 120V power outlet socket are disposed within the same housing with the vibration sensing element remote to said housing.

It is thought that the method and apparatus of the present invention will be understood from the foregoing description, and that it will be apparent that various changes may be made in form, construct steps, and arrangement of the parts and steps thereof, without departing from the spirit and scope of the invention, or sacrificing all of their material advantages. The form herein described is merely a preferred exemplary example embodiment thereof.

What is claimed is:
1. A vibration detector switch system comprising:
  a mountable housing, sized and configured to be non-invasively coupled to an equipment enclosure that exhibits vibration during the normal operating cycle of a motorized equipment therein;
  said mountable housing having electric connection to a constant power source;
  electric connection for a switched auxiliary appliance;
  a piezo-electric transducer;

a vibration sensing system, coupled to said transducer; and configured for determining when said motorized equipment is operating;

said vibration sensing system being further configured to facilitate provisioning of power to said switched auxiliary appliance and further configured to terminate power being provisioned to said switched auxiliary appliance;

a detector control circuit comprising:
- a direct-current bias voltage applied to said transducer configured to allow active detection of the alternating-current voltage signal emanating from said transducer in the presence of said vibration;
- a high-pass filter configured to remove said bias from said signal thereby outputting a sine wave whose peak voltage is proportional to said vibration;
- an amplifier configured to receive said sine wave and increase the magnitude of said sine wave to an amplified wave;
- said detector control circuit configured to do one of:
  - compare a first adjustable direct-current voltage setpoint with the positive peak voltage of said amplified wave; and
  - output a comparator signal when said positive peak voltage is greater than said setpoint;
  - enable a first light indication when said comparator signal is present;
  - modify said comparator signal such that a constant confirmation signal is produced if said comparator signal is recurrent and continuous;
  - adjust the duration of said confirmation signal such that an operation signal whose continued duration following the termination of said confirmation signal is determined by a second adjustable setpoint;
  - enable a second light indication when said operation signal is present; and
  - said detector control circuit further configured to enable a relay to connect said power source to said switched auxiliary appliance when operation signal is present.

2. The system of claim 1 wherein:
said mountable housing is lower housing 101 and lid 102;
said equipment enclosure is furnace 122;
said constant power source is AC power source 132;
said electric connection to a constant power source is 2-position line power terminal block 103;
said switched auxiliary appliance is humidifier 128;
said electric connection for a switched auxiliary appliance is 2-position load terminal block 104;
said piezo-electric transducer is piezo-electric transducer 110;
said detector control circuit is detector control circuit 100;
said direct-current bias voltage is DC bias 113;
said high-pass filter is high-pass filter 114;
said amplifier is amplifier 115;
said first adjustable direct-current voltage setpoint is sensitivity setpoint 105;
said comparator is comparator 116;
said first light indication is detection indicator 106;
said second light indication is relay state indicator 108; and
said relay is relay 111.

3. The system of claim 1 wherein said detector control circuit is free from any input from an accelerometer, strain gauge, coiled-spring switch, eddy-current sensors, inductive sensor, capacitive sensor, or mass-loaded flexible film piezoelectric sensor.

4. The system of claim 1 further comprising an electrical conductor extending from said constant power source to said vibration detector switch.

5. The system of claim 1 further comprising an electrical conductor extending from said vibration detector switch to said switched auxiliary appliance.

* * * * *